United States Patent
Chen et al.

(10) Patent No.: US 7,473,607 B2
(45) Date of Patent: Jan. 6, 2009

(54) METHOD OF MANUFACTURING A MULTI-WORKFUNCTION GATES FOR A CMOS CIRCUIT

(75) Inventors: Xiangdong Chen, Poughquag, NY (US); Rajesh Rengarajan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 231 days.

(21) Appl. No.: 11/175,762

(22) Filed: Jul. 6, 2005

(65) Prior Publication Data

US 2007/0020865 A1    Jan. 25, 2007

(51) Int. Cl.
*H01L 21/00* (2006.01)
*H01L 21/44* (2006.01)

(52) U.S. Cl. .................. 438/301; 438/303; 438/305; 438/456; 438/654; 438/756; 257/E21.024; 257/E21.025; 257/E21.303; 257/E21.345; 257/E23.09

(58) Field of Classification Search .......... 438/301; 257/202, E21.622
See application file for complete search history.

(56) References Cited

U.S. PATENT DOCUMENTS

| | | | |
|---|---|---|---|
| 7,314,829 B2 * | 1/2008 | Weiss et al. ............... | 438/682 |
| 2004/0262642 A1 * | 12/2004 | Shimamoto et al. ......... | 257/202 |
| 2005/0023564 A1 * | 2/2005 | Ding ......................... | 257/202 |

* cited by examiner

*Primary Examiner*—Michael S Lebentritt
(74) *Attorney, Agent, or Firm*—H. Daniel Schnurmann; Greenblum & Bernstein P.L.C.

(57) ABSTRACT

A method of manufacturing a device includes doping a low voltage threshold area and a high voltage threshold area. Gate structures are formed over the low voltage threshold and high voltage threshold areas while protecting the gate structure over the low voltage threshold area. A silicidation process is performed over the high voltage threshold area while the gate structure over the low voltage threshold area remains protected. Siliciding includes depositing metal on the gate of the high voltage threshold area and annealing the metal, the metal is deposited either by CVD or sputtering followed by anneal to fully suicide the gate structure of the high voltage threshold area. The metal, preferably cobalt or nickel is deposited to a thickness of approximately 500 Å, annealed for about 3 minutes at about 400° C.

13 Claims, 4 Drawing Sheets

METHOD OF MANUFACTURING A MULTI-WORKFUNCTION GATES FOR A CMOS CIRCUIT

FIELD OF THE INVENTION

The invention relates to a method of manufacturing CMOS device, and more particularly to CMOS devices with stressed channels and thin gates.

BACKGROUND DESCRIPTION

Low power circuits are widely used in mobile devices. To meet the low power requirement, subthreshold leakage (dependent on $V_t$ (voltage threshold)), gate leakage and gate induced drain leakage need to be controlled very precisely. In the low power circuit, both the low $V_t$ device and the high $V_t$ device have different circuit performance requirements, and the $V_t$ difference between high $V_t$ and low $V_t$ can be up to 200 mV.

As the channel length and gate oxide are scaled down, higher halo or channel doping are needed to maintain high $V_t$ (~0.5V) for low power applications. However, the high doping increases the junction and gate induced drain leakage (GIDL), which is not acceptable for low power devices which have $V_t$ around 0.5V and Ioff around 0.01 nA/um.

Gate materials with different work function are used to adjust $V_t$ as shown in equation 1, below.

$$V_t = \phi_m - \phi_s - Q_{ox}/C_{ox} + 2\psi_B + (4\epsilon_{si}qN_a\psi_B)^{1/2}/C_{ox} \quad (1)$$

$\phi_m$ and $\phi_s$ are work functions of the material forming the gate and of the silicon substrate. $Q_{ox}$ represents the charge in the gate dielectric, and $C_{ox}$ is the gate dielectric capacitance. $\psi_B$ is the difference of potential between Fermi's level and the intrinsic Fermi level. $N_a$ is the doping concentration in the channel.

By way of example, fully silicide (FUSI) gate devices have attracted much attention because it can reduce the gate depletion and improve the device performance. In such an application, midgap workfunction gate material is applied to both high $V_t$ and low $V_t$ devices. But, the silicide has a workfunction close to the midgap of Si which requires count doping for low $V_t$ (~200 mV) devices. This is because positive $\phi_m - \phi_s$ is required for nFET devices and negative $\phi_m - \phi_s$ is required for pFET devices.

But, the count doping will degrade the $V_t$-roll off and performance. Also, midgap workfunction gate material is very good for high $V_t$ devices because high $V_t$ can be achieved with low channel/halo doping. Therefore, the junction and GIDL leakage can be reduced which is critical for low power application because the total Ioff leakage is very small. But, this process is not beneficial for low $V_t$ devices, since the $V_t$ in such devices would be too high.

SUMMARY OF THE INVENTION

In a first aspect of the invention, a method of manufacturing a device includes doping a low voltage threshold area and a high voltage threshold area. The method further includes forming gate structures over the low voltage threshold area and the high voltage threshold area and protecting the gate structure over the low voltage threshold area. A silicidation process is performed over the high voltage threshold area while the gate structure over the low voltage threshold area remains protected.

In another aspect of the invention, the method includes providing a substrate with a low voltage threshold area and a high voltage threshold area and doping the low voltage threshold area and the high voltage threshold area with a dopant. A gate structure is formed over the low voltage threshold area and the high voltage threshold area which includes sidewalls and a cap. An oxidation process is performed to cover exposed areas of the substrate. The cap of the gate structure of the high voltage threshold area is etched to expose the gate structure of the high voltage threshold area. A siliciding process is performed on the exposed gate structure of the high voltage threshold area while the gate structure of the low voltage threshold area remains protected.

In another aspect of the invention, a device comprises a first device formed in a low voltage threshold area and a second device formed in a high voltage threshold area. The second device has gate material with workfunction close to a midgap of Si and the first device has gate material with workfunction close to a valence band of P+ poly silicon.

DETAILED DESCRIPTION OF EMBODIMENTS OF THE INVENTION

In general, embodiments of the invention include a CMOS circuit with midgap work function material used for a high $V_t$ (voltage threshold) device and a polysilicon material used for a low $V_t$ device. In the method and structure of the invention, the channel $V_t$ implant can be the same for the high $V_t$ device and the low $V_t$ device. In embodiments, the high $V_t$ can be achieved without high channel doping. By using the method of the invention, a final structure can be achieved in which at least, (i) the hole mobility of the electrons can be improved with low channel doping, (ii) poly depletion can be removed which increases device performance and (iii) GIDL and junction leakage can be reduced which is beneficial for high $V_t$ devices which have very small subthreshold leakage and GIDL. As should be understood by those of skill in the art, junction leakage is important to meet the total leakage requirement.

Figure 1:
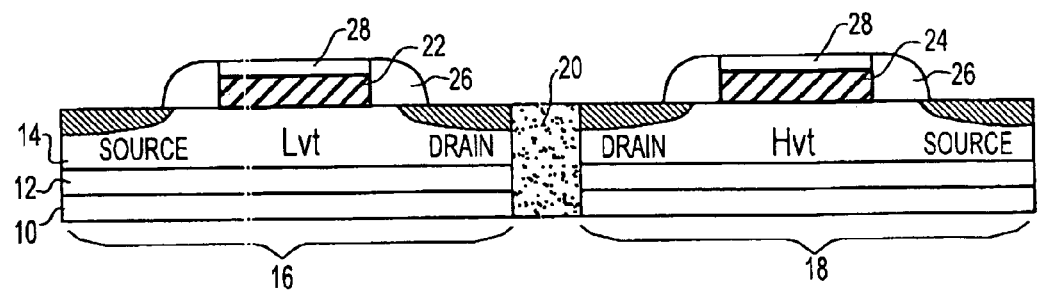
FIGS. 1-7 represent steps of manufacturing a device in accordance with the invention.

Referring to FIG. 1, an example of a starting structure for an embodiment in accordance with the invention is shown. In FIG. 1, an optional oxide BOX 12 is formed on a substrate 10 and an SOI layer 14 is formed on the optional BOX 12. In one aspect of the invention, an implantation process is provided for forming a low $V_t$ area 16. A high $V_t$ area 18 is also shown. In embodiments, either or both nFET device(s) and pFET device(s) may be formed on the low $V_t$ area, the high $V_t$ area or combinations thereof. An STI 20 region, e.g., oxide, is formed between the FETs, e.g., the low $V_t$ area 16 and the high $V_t$ area 18.

In the process steps of FIG. 1, dopants, for example, phosphorous (P), arsenic (As), antimony (Sb), etc. are used for the fabrication of the pFET device(s) and, for example, boron (B), indium (In), boron fluoride ($BF_2$), etc. are used for the fabrication of the nFET device(s). In one implementation, doping occurs at a common energy level and dosage, depending on a particular application. Typical dopant energy levels for As, for example, range from about 40 Kev to 100 Kev and for $Bf_2$ from about 10 Kev to 40 Kev. Energy levels for B may range from about 2 Kev to 10 Kev, for example. Doping for $Bf_2$ or As implants may range from about $1e^{12}$ to $5e^{12}$, with resultant concentrations of about $1e^{17}$ to $1e^{18}$.

In FIG. 1, using conventional and well-known methods, a poly silicon gate 22 is formed over the low $V_t$ area 16 and a polysilicon gate 24 is formed over the high $V_t$ area 18. Nitride spacers 26 are formed on the sidewalls of the polysilicon gate 22 and the polysilicon gate 24, which may be of the same material. Additionally, nitride caps 28 are formed on the respective polysilicon gate 22 and the polysilicon gate 24. Source and drain regions are formed in the SOI by conventional methods, on sides of the channels formed by the polysilicon gate 22 and the polysilicon gate 24.

Figure 2:
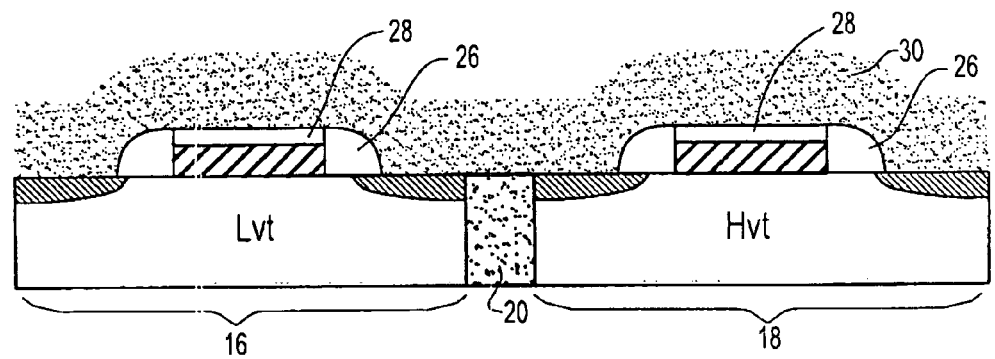
Figure 3:
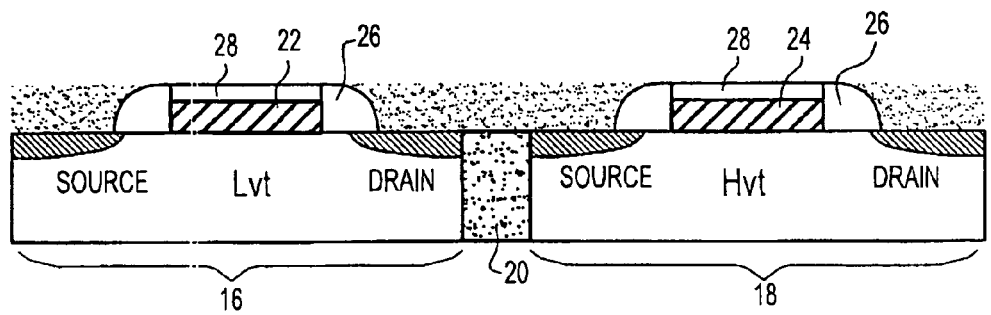

Referring to FIGS. 2 and 3, an oxidation layer 30 is deposited over the structure of FIG. 1 by a low temperature furnace, well known to those of skill in the art. The oxide layer 30 is planarized to result in the structure of FIG. 3. The planarization process may be, for example, a chemical mechanical polishing (CMP) suitable for the structure shown in FIG. 3. The CMP is performed to flatten the surface and stop on the nitride layer 28 above the polysilicon gates 22 and 24.

Figure 4:
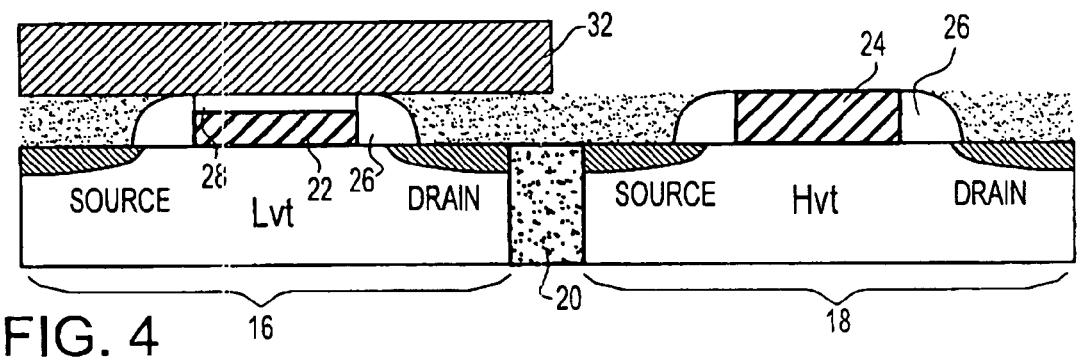

FIG. 4 shows a photoresist 32 applied over the low $V_t$ area 16. In this processing step, the photoresist 32 is etched away from the high $V_t$ area 18. The nitride cap 28 over the high $V_t$ area 18 is also etched to expose the polysilicon gate 24.

Figure 5:
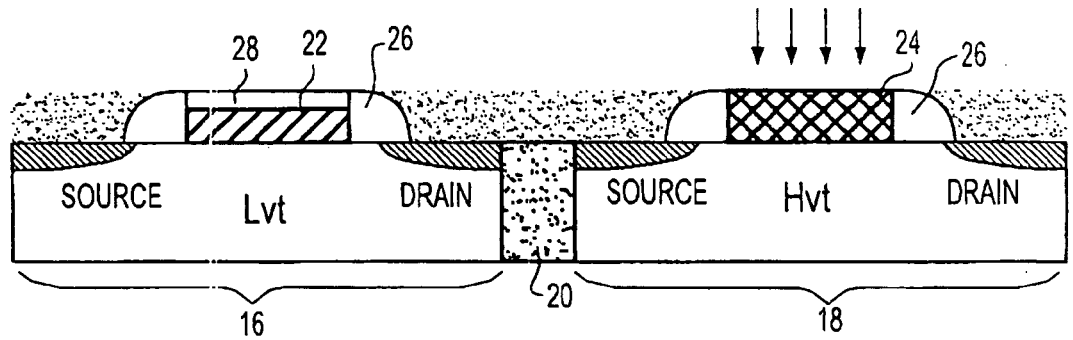

In FIG. 5, the photoresist is etched from the low $V_t$ area 16, leaving the nitride cap 28 substantially intact. The nitride cap 28, above the polysilicon gate 22, protects the polysilicon gate 22 during subsequent silicidation processes.

In the silicidation process of FIG. 5, a metal is deposited either by CVD or sputtering followed by anneal to fully silicide the poly gate 24. By way of further illustration, referring to FIG. 5, cobalt or nickel metal is deposited on the gate to a thickness of approximately 500 Å. Other silicides such as those shown in Table 1 can also be used in the processes of the invention. In this non-limiting illustration, the polysilicon gate 22 is approximately 1000 Å. The metal is annealed to form the whole silicide gate. Without any fine-tuning, for an nFET, using nickel as one preferred metal, the high $V_t$ device will have a $V_t$ of 500 mv. The low $V_t$ device, using the conventional methods, will have a $V_t$ of approximately 200 mv, thus resulting in an acceptable difference of 300 mv. In a pFET device, using nickel as one preferred metal, the difference between the high $V_t$ device and the low $V_t$ device is approximately 700 mv.

Figure 6:
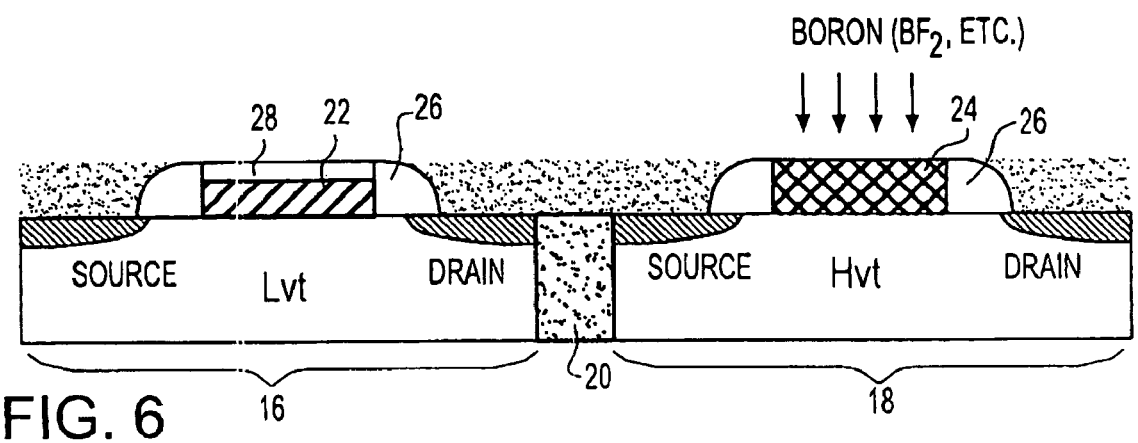

To lower the threshold voltage difference between the high $V_t$ device and the low $V_t$ device in a pFET device, implanting of a midgap workfunction gate material may be used, as represented in FIG. 6. The use of the midgap workfunction gate material may also be used to fine tune the nFET device, for example. These midgap workfunction gate materials may include, for example, the materials shown in the table below.

TABLE I

| Metal | Workfunction (V) | Silicide | Workfunction (V) |
|---|---|---|---|
| Al | 4.71–4.81 | $CrSi_2$ | 4.64 |
| Au | 4.9 | $MoSi_2$ | 4.62 |
| Cr | 4.65 | $NiSi_2$ | 4.72 |
| Mo | 4.65 | $Pd_2Si_2$ | 4.78 |
| Ti | 4.57 | PtSi | 4.9 |
| W | 4.67 | $TiSi_2$ | 4.65 |
|  |  | $WSi_2$ | 4.7 |

Referring to an optional step shown in FIG. 6, the workfunction of the high $V_t$ device can also be fine tuned by implanting boron or aluminum or other midgap workfunction gate material, e.g., Sb or As, in the high $V_t$ device, e.g., into the silicide. By this approach, the difference between the high $V_t$ and the low $V_t$ can be lowered to about 100 to 200 mv for an nFET device, for example.

Figure 7:
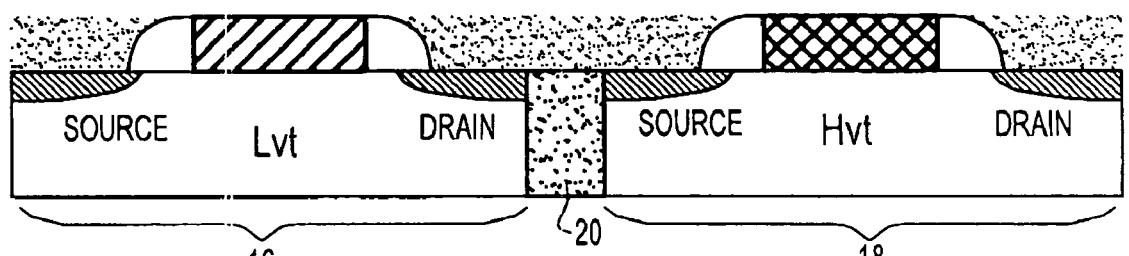

As represented in FIG. 7, after the gate silicidation process of FIG. 5 (or FIG. 6), a selective etch for the metal, e.g., cobalt, nickel, etc. is provided to etch away such material from the nitride cap 28 of the low $V_t$ device. The nitride cap 28 is selectively etched. Normal midline and back end CMOS processes are used to fabricate the CMOS circuit.

Figure 8:
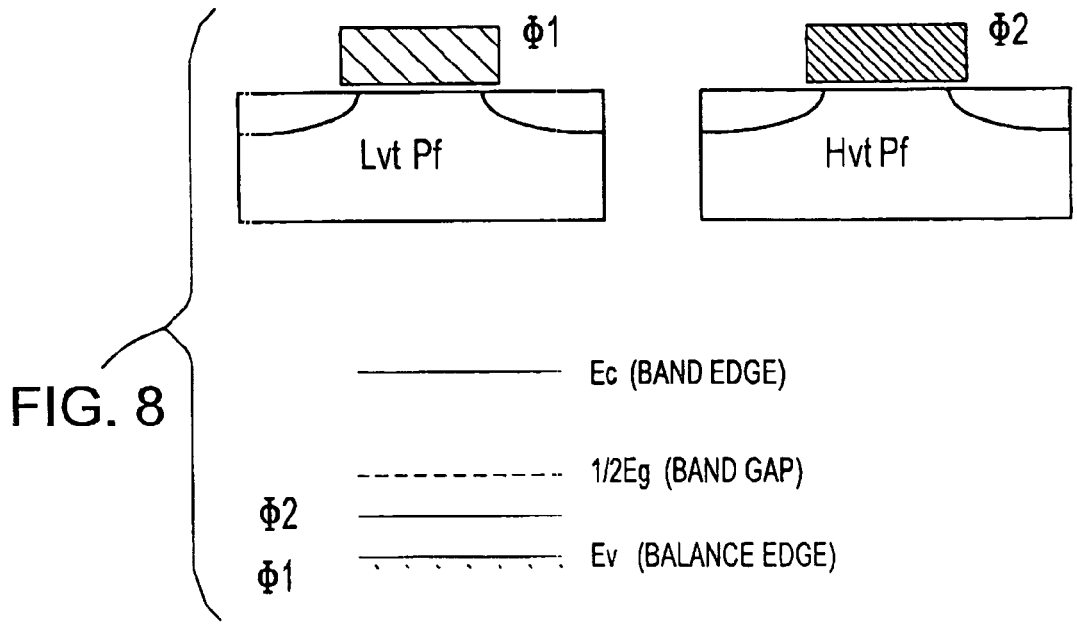
FIG. 8 represents high $V_t$ and low $V_t$ pFET devices manufactured in accordance with the invention.
Figure 9:
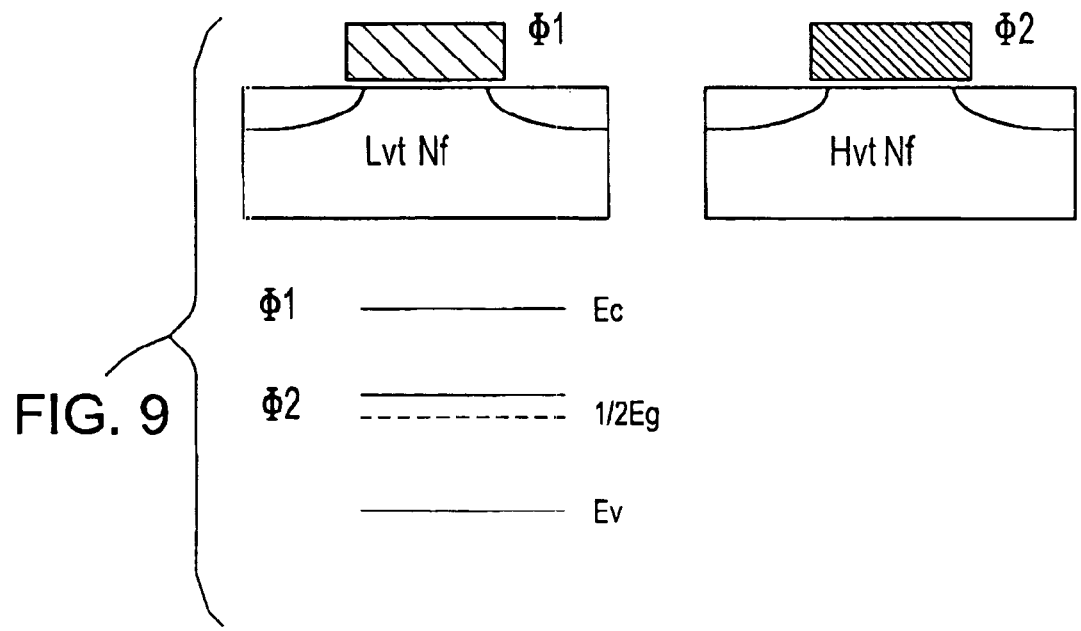
FIG. 9 represents high $V_t$ and low $V_t$ nFET devices manufactured in accordance with the invention.

FIGS. 8 and 9 show embodiments for a pFET device and an nFET device, respectively. Referring to FIG. 8, in the same circuit, a high $V_t$ pFET device and a low $V_t$ pFET device are shown as one illustrative embodiment. In the embodiment shown in FIG. 8, the work function of the gate materials for the two different $V_t$ devices is different, e.g., the high $V_t$ device has gate material with work function close to the midgap of Si such as silicide and the low $V_t$ device has gate material with workfunction close to the valence band such as P+ poly silicon. In the illustrative example of FIG. 8, the work function difference is ($\Phi 2 - \Phi 1$) which is the $V_t$ difference of the two devices if the channel doping is the same for the two device. Table 1 shows the workfunction of different materials.

As discussed above, the work function of the silicide can also be adjusted slightly by implant of Al, B, Sb, As, etc. Therefore, the high $V_t$ can be achieved with low channel doping which is helpful to control the GIDL. While, for the low $V_t$ device, gate material with workfunction close to the gate is used, the low $V_t$ can be achieved without any count doping.

FIG. 9 shows the embodiments for an nFET device with both high $V_t$ and low $V_t$. In the embodiment of FIG. 9, the work function difference is ($\Phi 2 - \Phi 1$) which is the $V_t$ difference of the high $V_t$ and the low $V_t$, for an nFET device, if the channel doping is the same for the two devices.

Thus, in accordance with the invention, the low $V_t$ device and the high $V_t$ device are first doped similar to one another, at an early stage of fabrication. Then, a silicidation process is applied to the high $V_t$ device while the low $V_t$ device is protected. The $V_t$ of the high $V_t$ device can then be fine-tuned. In this manner, an acceptable voltage range between the high $V_t$ device and the low $V_t$ device is achieved. This results in improved circuit performance. That is, the hole and electron mobility in the channel can be improved with low channel doping, poly depletion can be removed and GIDL and junction leakage can be reduced.

While the invention has been described in terms of exemplary embodiments, those skilled in the art will recognize that the invention can be practiced with modifications and in the spirit and scope of the appended claims.

What is claimed is:

1. A method of manufacturing a device, comprising:
   doping a low voltage threshold area and a high voltage threshold area formed in a substrate;
   forming gate structures over the low voltage threshold area and the high voltage threshold area;
   protecting the gate structure over the low voltage threshold area; and
   performing a silicidation process over the high voltage threshold area while the gate structure over the low voltage threshold area remains protected, wherein:
   the silicidation process includes depositing a metal on the gate structure of the high voltage threshold area and annealing the metal, the metal is deposited either by CVD or sputtering followed by anneal to fully silicide the gate structure of the high voltage threshold area, and wherein the metal is cobalt or nickel deposited to a thickness of approximately 500 Å which is annealed for about 3 minutes at about 400° C.

2. The method of claim 1, further comprising stripping a nitride cap from the gate structure of the high voltage threshold area prior to performing the silicidation process.

3. The method of claim 1, further comprising depositing an oxidation layer over the substrate including the gate structure of the low voltage threshold area and the high voltage threshold area.

4. The method of claim 3, further comprising planarizing the oxidation layer at least over the gate structures of the low voltage threshold area and the high voltage threshold area.

5. The method of claim 4, wherein the planarizing is stopped on the nitride cap layer above the gate structures of the low voltage threshold area and the high voltage threshold area.

6. The method of claim 1, wherein the protecting step comprises patterning a photoresist over the low voltage threshold area, and the patterning includes etching away a cap formed over the gate structure of the high voltage threshold area to expose the gate structure of the high voltage threshold area.

7. The method of claim 6, further comprising etching the photoresist over the low voltage threshold area, leaving a nitride cap substantially intact to protect the gate structure of the low voltage threshold area during the silicidation process.

8. The method of claim 1, further comprising fine-tuning a voltage threshold of the high threshold area by implanting a midgap workfunction gate material.

9. A method of manufacturing a device, comprising:

providing a substrate with a low voltage threshold area and a high voltage threshold area;

doping the low voltage threshold area and the high voltage threshold area with a dopant;

forming a gate structure over the low voltage threshold area and the high voltage threshold area which includes sidewalls and a cap;

performing an oxidation process to cover exposed areas of the substrate;

etching the cap of the gate structure of the high voltage threshold area to expose the gate structure of the high voltage threshold area; and siliciding the gate structure of the high voltage threshold area while the gate structure of the low voltage threshold area remains protected, wherein:

the siliciding includes depositing a metal on the gate structure of the high voltage threshold area and annealing the metal, the metal is deposited either by CVD or sputtering followed by anneal to fully silicide the gate structure of the high voltage threshold area, and the metal is cobalt or nickel deposited to a thickness of approximately 500 Å which is annealed for about 3 minutes at about 400° C.

10. The method of claim 9, wherein the protecting of the gate structure of the low voltage threshold area includes patterning a photoresist over the gate structure of the low voltage threshold area, including the oxide layer over the low voltage threshold area.

11. The method of claim 9, wherein the high voltage threshold area and the low voltage threshold area include an nFET device or a pFET device.

12. The method of claim 11, wherein the doping for the pFET device is one of P, As, and Sb and for the nFET device are one of B, In and $BF_2$.

13. The method of claim 9, further comprising fine-tuning a voltage threshold of the high threshold area by implanting a midgap workfunction gate material.

\* \* \* \* \*